United States Patent
Furusawa et al.

(10) Patent No.: US 11,227,974 B2
(45) Date of Patent: Jan. 18, 2022

(54) NITRIDE SEMICONDUCTOR LIGHT-EMITTING ELEMENT AND PRODUCTION METHOD FOR NITRIDE SEMICONDUCTOR LIGHT-EMITTING ELEMENT

(71) Applicant: NIKKISO CO., LTD., Tokyo (JP)

(72) Inventors: Yuta Furusawa, Ishikawa (JP); Mitsugu Wada, Ishikawa (JP); Yusuke Matsukura, Ishikawa (JP); Cyril Pernot, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 30 days.

(21) Appl. No.: 16/645,886

(22) PCT Filed: Jul. 31, 2018

(86) PCT No.: PCT/JP2018/028652
§ 371 (c)(1),
(2) Date: Mar. 10, 2020

(87) PCT Pub. No.: WO2019/054068
PCT Pub. Date: Mar. 21, 2019

(65) Prior Publication Data
US 2020/0279973 A1    Sep. 3, 2020

(30) Foreign Application Priority Data
Sep. 12, 2017 (JP) .............................. JP2017-174849

(51) Int. Cl.
*H01L 33/32* (2010.01)
*H01L 33/00* (2010.01)
*H01L 33/06* (2010.01)

(52) U.S. Cl.
CPC .......... *H01L 33/06* (2013.01); *H01L 33/0066* (2013.01); *H01L 33/0075* (2013.01); *H01L 33/32* (2013.01)

(58) Field of Classification Search
CPC ................ H01L 33/32; H01L 33/0075; H01L 33/0066; H01L 33/06; H01L 33/007;
(Continued)

(56) References Cited

U.S. PATENT DOCUMENTS 6,388,275 B1    5/2002  Kano
8,823,047 B2 *  9/2014  Han ...................... H01L 33/025
                                                257/101
(Continued)

FOREIGN PATENT DOCUMENTS

JP    H11-068158 A    3/1999
JP    2012-044120 A   3/2012
(Continued)

OTHER PUBLICATIONS

Notice of Reasons for Refusal dated Feb. 16, 2021 received from the Japanese Patent Office in related application 2018-129044 together with English language translation.
(Continued)

*Primary Examiner* — Savitri Mulpuri
(74) *Attorney, Agent, or Firm* — Scully, Scott, Murphy & Presser, P.C.

(57) ABSTRACT

A nitride semiconductor light-emitting element includes an n-type cladding layer including n-type AlGaN having a first Al composition ratio, a barrier layer including AlGaN that is located on the n-type cladding layer side in a multiple quantum well layer and has a second Al composition ratio greater than the first Al composition ratio, and a graded layer that is located between the n-type cladding layer and the barrier layer and has a third Al composition ratio that is
(Continued)

between the first Al composition ratio and the second Al composition ratio, wherein the third Al composition ratio of the graded layer increases at a predetermined increase rate from the first Al composition ratio toward the second Al composition ratio.

5 Claims, 3 Drawing Sheets

(58) Field of Classification Search
CPC ... H01L 21/205; H01S 5/3216; H01S 5/2216; H01S 5/2206; H01S 5/34333
See application file for complete search history.

(56) References Cited

U.S. PATENT DOCUMENTS

| | | | |
|---|---|---|---|
| 10,944,026 B2* | 3/2021 | Matsukura | H01L 33/007 |
| 2009/0179221 A1 | 7/2009 | Han | |
| 2015/0372189 A1* | 12/2015 | Matsuura | H01L 33/32 257/13 |
| 2016/0079471 A1 | 3/2016 | Liao et al. | |
| 2018/0287014 A1* | 10/2018 | Asada | H01L 33/145 |
| 2019/0006558 A1 | 1/2019 | Watanabe et al. | |
| 2019/0148916 A1* | 5/2019 | Nakatani | H01S 5/0014 372/44.01 |
| 2019/0393378 A1* | 12/2019 | Wada | H01L 33/0075 |
| 2020/0006599 A1 | 1/2020 | Watanabe et al. | |
| 2020/0279971 A1* | 9/2020 | Furusawa | H01L 33/007 |

FOREIGN PATENT DOCUMENTS

| | | |
|---|---|---|
| JP | 2012-146847 A | 8/2012 |
| JP | 5521068 B1 | 6/2014 |
| JP | 2017-28076 A | 2/2017 |
| JP | 2017-34036 A | 2/2017 |
| WO | WO 2017/134713 A1 | 8/2017 |

OTHER PUBLICATIONS

International Search Report dated Aug. 28, 2018 issued in PCT/JP2018/028652.
JP Office Action dated Jan. 30, 2018 issued in JP 2017-174849.
JP Office Action dated May 8, 2018 issued in JP 2017-174849.

* cited by examiner

| No. | EMISSION WAVELENGTH (nm) | EMISSION OUTPUT (a. u.) |
|---|---|---|
| EXAMPLE 1 | 280.7 | 1.24 |
| EXAMPLE 2 | 283.3 | 1.28 |
| EXAMPLE 3 | 283.1 | 1.23 |
| EXAMPLE 4 | 281.7 | 1.25 |
| EXAMPLE 5 | 283.0 | 1.20 |
| COMPARATIVE EXAMPLE 1 | 279.8 | 0.74 |
| COMPARATIVE EXAMPLE 2 | 283.8 | 0.86 |

NITRIDE SEMICONDUCTOR LIGHT-EMITTING ELEMENT AND PRODUCTION METHOD FOR NITRIDE SEMICONDUCTOR LIGHT-EMITTING ELEMENT

TECHNICAL FIELD

The invention relates to a nitride semiconductor light-emitting element and a production method for nitride semiconductor light-emitting element.

BACKGROUND ART

In recent years, nitride semiconductor light-emitting elements such as light-emitting diodes or laser diodes which emit blue light have been put into practical use, and nitride semiconductor light-emitting elements with improved emission output have been under development (see Japanese Patent No. 5521068).

CITATION LIST

Patent Literature

Japanese Patent No. 5521068

SUMMARY OF INVENTION

Technical Problem

The nitride semiconductor light-emitting element described in Japanese Patent No. 5521068 is a Group III nitride semiconductor light-emitting element having an active layer between an n-type cladding layer and a p-type cladding layer, wherein the active layer has a multiple quantum well structure which includes not less than three barrier layers of $Al_xGa_{1-x}N$ ($0 \le x \le 1$) including a first barrier layer in contact with the n-type cladding layer, a second barrier layer in contact with the p-type cladding layer and one or more intermediate barrier layers located between the first and second barrier layers, and not less than two well layers of a Group III nitride semiconductor sandwiched between the barrier layers, the Al composition ratio X of the barrier layers gradually increases toward the first barrier layer and toward the second barrier layer from the intermediate barrier layer having the smallest Al composition ratio $X_{min}$ among the intermediate barrier layers, and the Al composition ratio $X_1$ of the first barrier layer, the Al composition ratio $X_2$ of the second barrier layer and the $X_{min}$ satisfy the following relation:

$X_2 + 0.01 \le X_1$ $X_{min} + 0.03 \le X_2$

In the nitride semiconductor light-emitting element described in Japanese Patent No. 5521068, however, the Al composition ratio changes sharply at an interface between the n-type cladding layer and the first barrier layer. This causes V-shaped deepening (hereinafter, also referred to as "notch") in the band structure to occur at the interface and the flow of electrons is likely to be interrupted since electrons are captured in the notch. In addition, an electric field is generated at such an interface due to the piezoelectric effect and the flow of electrons is also likely to be interrupted by the electric field. In case of the nitride semiconductor light-emitting element described in Japanese Patent No. 5521068, a decrease in emission output may occur due to such factors.

Therefore, it is an object of the invention to provide a nitride semiconductor light-emitting element of which emission output can be improved by preventing a notch in the band structure, which may occur at an interface between an n-type cladding layer and a barrier layer located on the n-type cladding layer side in a multiple quantum well layer, and also by reducing an electric field generated due to the piezoelectric effect. It is also an object of the invention to provide a production method for such a nitride semiconductor light-emitting element.

Solution to Problem

A nitride semiconductor light-emitting element according to an embodiment of the invention comprises an n-type cladding layer comprising n-type AlGaN and having a first Al composition ratio; a barrier layer comprising AlGaN that is located on the n-type cladding layer side in a multiple quantum well layer and has a second Al composition ratio greater than the first Al composition ratio; and a graded layer that is located between the n-type cladding layer and the barrier layer and has a third Al composition that is between the first Al composition ratio and the second Al composition ratio, wherein the third Al composition ratio of the graded layer increases at a predetermined increase rate from the first Al composition ratio toward the second Al composition ratio.

A production method for a nitride semiconductor light-emitting element in another embodiment of the invention comprises forming an n-type cladding layer comprising n-type AlGaN on a substrate; forming a barrier layer comprising AlGaN that is located on the n-type cladding layer side in a multiple quantum well layer and has a second Al composition ratio greater than the first Al composition ratio; and forming a graded layer that is located between the n-type cladding layer and the barrier layer and has a third Al composition that is between the first Al composition ratio and the second Al composition ratio, wherein the forming the graded layer is performed while increasing an Al feed rate so that the third Al composition ratio increases at a predetermined increase rate from the first Al composition ratio toward the second Al composition ratio.

Advantageous Effects of Invention

According to an embodiment of the invention, it is possible to provide a nitride semiconductor light-emitting element of which emission output can be improved by preventing a notch in the band structure, which may occur at an interface between an n-type cladding layer and a barrier layer located on the n-type cladding layer side in a multiple quantum well layer, and also by reducing an electric field generated due to the piezoelectric effect. It is also possible to provide a production method for such a nitride semiconductor light-emitting element.

DESCRIPTION OF EMBODIMENT

Embodiment

An embodiment of the invention will be described in reference to FIGS. 1 to 3A, B. The embodiment below is described as a preferred example for implementing the invention. Although some part of the embodiment specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element.

Figure 1:
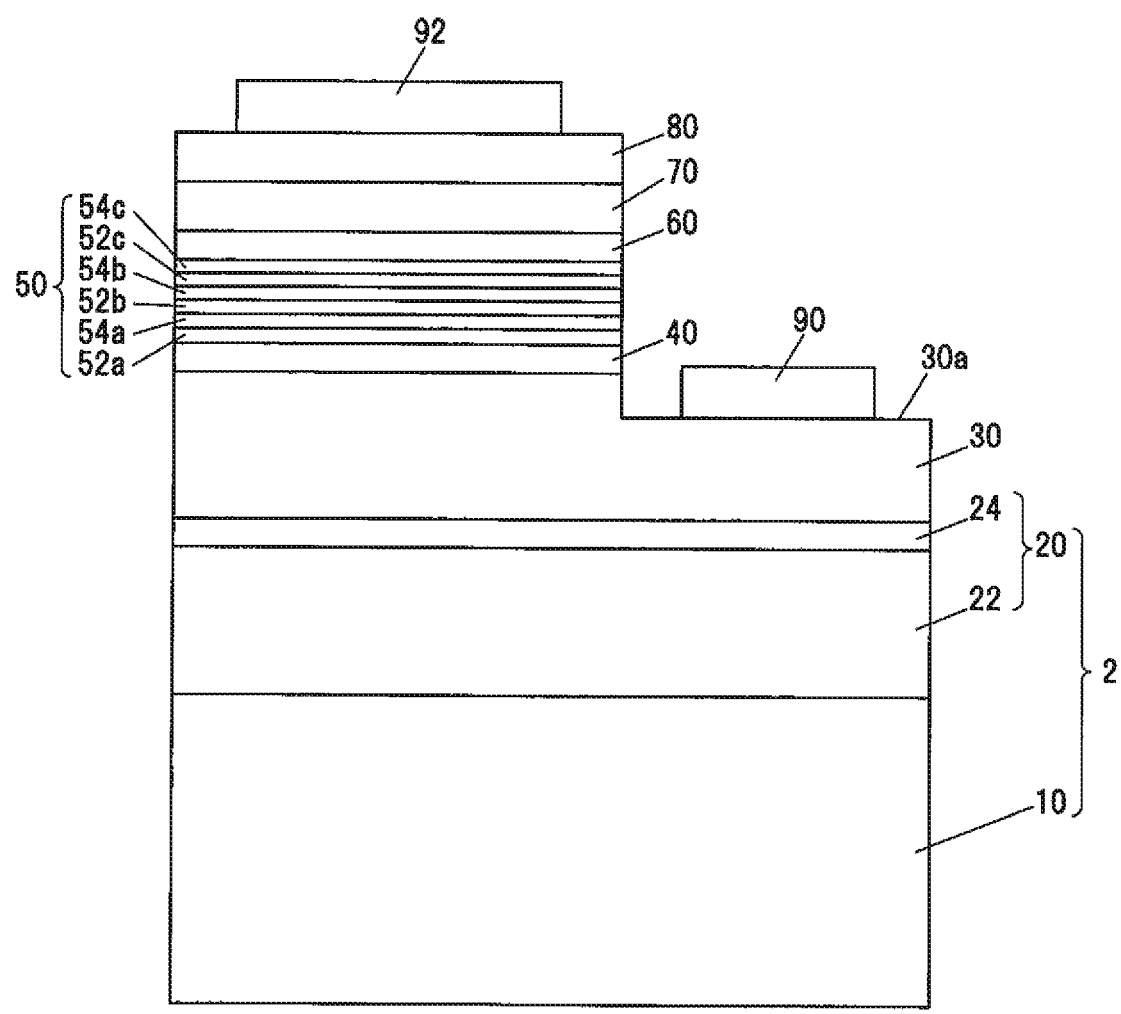
FIG. 1 is a schematic cross-sectional view showing an exemplary configuration of a nitride semiconductor light-emitting element in an embodiment of the present invention.

FIG. 1 is a schematic cross-sectional view showing an exemplary configuration of a nitride semiconductor light-emitting element in an embodiment of the invention. A nitride semiconductor light-emitting element 1 (hereinafter, also simply referred to as "light-emitting element 1") is a light-emitting diode (LED) which emits light with a wavelength in the ultraviolet region. In the present embodiment, the light-emitting element 1 emitting deep ultraviolet light with a central wavelength of 250 nm to 350 nm is specifically described as an example.

As shown in FIG. 1, the light-emitting element 1 includes a substrate 10, a buffer layer 20, an n-type cladding layer 30, a graded layer 40, a light-emitting layer 50 including a multiple quantum well layer, an electron blocking layer 60, a p-type cladding layer 70, a p-type contact layer 80, an n-side electrode 90 and a p-side electrode 92.

The semiconductor which can be used to form the light-emitting element 1 is, e.g., a binary, ternary, or quaternary group III nitride semiconductor which is expressed by $Al_xGa_yIn_{1-x-y}N$ (0≤x≤1, 0≤y≤1, 0≤x+y≤1). In addition, the group III elements thereof may be partially substituted with boron (B) or thallium (Tl), etc., and N may be partially substituted with phosphorus (P), arsenic (As), antimony (Sb) or bismuth (Bi), etc.

The substrate 10 is a substrate transparent to deep ultraviolet light emitted by the light-emitting element 1. The substrate 10 is, e.g., a sapphire ($Al_2O_3$) substrate. Besides the sapphire ($Al_2O_3$) substrate, e.g., an aluminum nitride (AlN) substrate or an aluminum gallium nitride (AlGaN) substrate may be used as the substrate 10.

The buffer layer 20 is formed on the substrate 10. The buffer layer 20 includes an AlN layer 22 and a u-$Al_pGa_{1-p}N$ layer 24 (0≤p≤1) which is undoped and formed on the AlN layer 22. The substrate 10 and the buffer layer 20 constitute a foundation structure 2. The u-$Al_pGa_{1-p}N$ layer 24 may not be necessarily provided.

The n-type cladding layer 30 is formed on the foundation structure 2. The n-type cladding layer 30 is a layer formed of AlGaN with n-type conductivity (hereinafter, also simply referred to as "n-type AlGaN") and is, e.g., an $Al_qGa_{1-q}N$ layer (0≤q≤1) doped with silicon (Si) as an n-type impurity. Alternatively, germanium (Ge), selenium (Se), tellurium (Te) or carbon (C), etc., may be used as the n-type impurity. The n-type cladding layer 30 has a thickness of about 1 μm to 3 μm and is, e.g., about 2 μm in thickness. The n-type cladding layer 30 may be a single layer or may have a multilayer structure.

The graded layer 40 is formed on the n-type cladding layer 30. The graded layer 40 is a layer formed of n-type AlGaN and is, e.g., an $Al_zGa_{1-z}N$ layer (0≤z≤1) doped with silicon (Si) as an n-type impurity. The graded layer 40 has a thickness of about 1 to 100 nm and is, e.g., about 25 nm in thickness. The graded layer 40 is a layer which serves to control the interface between the n-type cladding layer 30 and a barrier layer 52a located on the n-type cladding layer 30 side in the multiple quantum well layer (described later). In detail, the graded layer 40 serves to prevent a composition ratio of Al (hereinafter, also simply referred to as "Al composition ratio") from changing sharply between the n-type cladding layer 30 and the barrier layer 52a.

The light-emitting layer 50 including the multiple quantum well layer is formed on the graded layer 40. The light-emitting layer 50 is a multiple quantum well layer in which three $Al_rGa_{1-r}N$ barrier layers 52a, 52b, 52c, including the barrier layer 52a located on the n-type cladding layer 30 side in the multiple quantum well layer, and three $Al_sGa_{1-s}N$ well layer 54a, 54b, 54c (0≤r≤1, 0≤s≤1, r>s, see FIG. 2) are alternately stacked. The light-emitting layer 50 is configured to have a band gap of not less than 3.4 eV so that deep ultraviolet light with a wavelength of not more than 350 nm is output.

Figure 2:
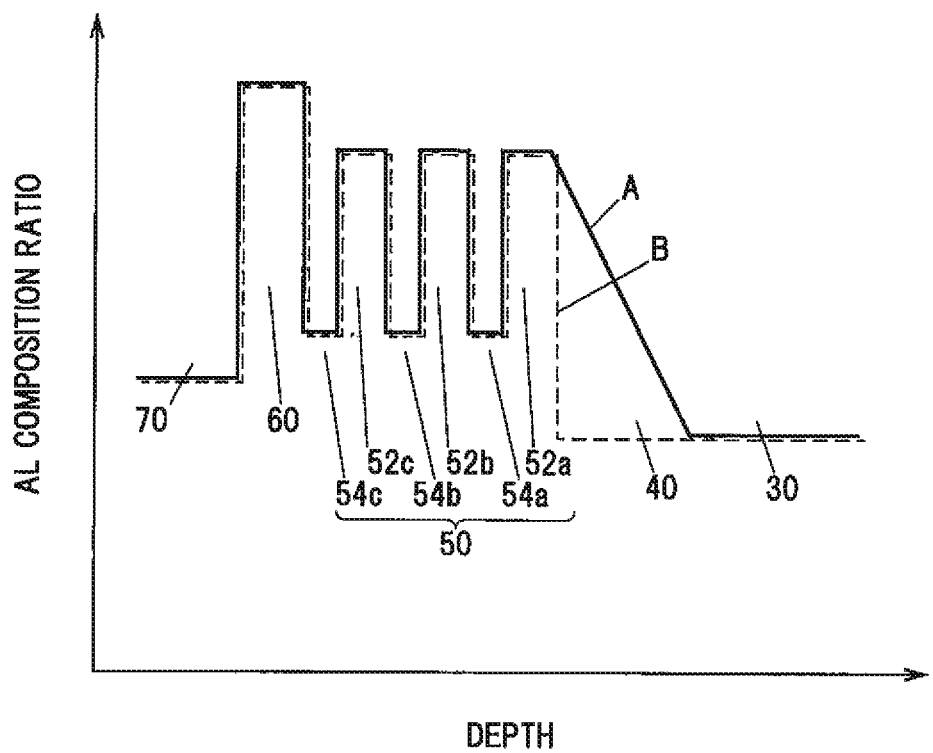
FIG. 2 is a graph schematically showing an Al composition ratio of the light-emitting element of the invention in comparison with an Al composition ratio of a conventional light-emitting element.

The Al composition ratio of the light-emitting element 1 will be described in reference to FIG. 2. FIG. 2 is a graph schematically showing the Al composition ratio of the light-emitting element 1 in comparison with the Al composition ratio of a conventional light-emitting element. The line labeled A in FIG. 2 shows the Al composition ratio of the light-emitting element 1 of the invention, and the line labeled B in FIG. 2 shows the Al composition ratio of the conventional light-emitting element. Here, "AlN mole fraction" (%) can be used as another expression for the Al composition ratio.

The Al composition ratio of the n-type cladding layer 30 (hereinafter, also referred to as "first Al composition ratio") is about 40% to 60%, preferably about 50% to 60%, more preferably about 54.6%. Meanwhile, the Al composition ratio of the barrier layer 52a (hereinafter, also referred to as "second Al composition ratio") is higher than the first Al composition ratio and is, e.g., not less than 70%, preferably not less than 80%. The same applies to the barrier layers 52b and 52c, but the explanation thereof is omitted here.

The Al composition ratio of the graded layer 40 increases from the first Al composition ratio to the second Al composition ratio at a predetermined increase rate so that a notch in the band structure, which would occur at an interface between the n-type cladding layer 30 and at least the barrier layer 52a, can be prevented and an electric field generated due to the piezoelectric effect can be also reduced. In other words, the Al composition ratio of the graded layer 40 (hereinafter, also referred to as "third Al composition ratio") increases diagonally in the depth direction of the light-emitting element 1 from the first Al composition ratio (e.g., about 55%) to the second Al composition ratio (e.g., about 80%).

In detail, the Al composition ratio of the graded layer 40 increases diagonally and substantially linearly from the first Al composition ratio (e.g., about 55%) to the second Al composition ratio (e.g., about 80%). In other words, the Al composition ratio of the graded layer 40 increases from the first Al composition ratio (e.g., about 55%) to the second Al composition ratio (e.g., about 80%) at a constant increase rate. The details of the increase rate will be described later.

To prevent occurrence of a notch in the band structure and a sharp increase in the Al composition ratio which leads to generation of an electric field due to piezoelectric effect, the increase rate takes a value which is not less than a predetermined value (the lower limit). Preferably, the increase rate is not less than the predetermined value (the lower limit). When the increase rate is less than the predetermined value (the lower limit), the graded layer 40 needs to be thicker than 100 nm and thus has a higher electrical resistance, hence, requiring prevention of an increase in forward voltage.

More preferably, the Al composition ratio of the graded layer 40 increases from 54.6% to 82.0% between 55.3 nm and 83.1 nm in depth, where the upper surface of the p-type cladding layer 70 is defined as 0 mm. That is, the Al composition ratio of the graded layer 40 increases at an increase rate of about 28% per about 28 nm. In other words, an Al composition ratio $X_{Al}$ (%) satisfies the following relation:

$$X_{Al}(\%) = -(1.0\pm0.1) \times D(nm) + X_0$$

where the depth of the light-emitting element 1 (the positive depth value in a direction from the p-type cladding layer 70 side toward the n-type cladding layer 30) is D(nm) and $X_0$ is a coefficient with a predetermined value.

However, the Al composition ratio of the graded layer 40 is not limited to the ratio which increases diagonally and linearly from the first Al composition ratio to the second Al composition ratio. For example, the Al composition ratio of the graded layer 40 may stepwise increase at every predetermined depth for several times from the first Al composition ratio to the second Al composition ratio, or may increase diagonally and curvilinearly from the first Al composition ratio to the second Al composition ratio. "Diagonally and curvilinearly" means a change which increases from the n-type cladding layer 30 side toward the barrier layer 52 in, e.g., an upwardly or downwardly convex parabolic manner. In other words, the Al composition ratio of the graded layer 40 may change at a varying increase rate from the n-type cladding layer 30 side toward the barrier layer 52.

The electron blocking layer 60 is formed on the light-emitting layer 50. The electron blocking layer 60 is a layer formed of AlGaN with p-type conductivity (hereinafter, also simply referred to as "p-type AlGaN"). The electron blocking layer 60 has a thickness of about 1 nm to 10 nm. Alternatively, the electron blocking layer 60 may include a layer formed of AlN or may be formed of AlN not containing GaN. In addition, the electron blocking layer 60 is not necessarily limited to a p-type semiconductor layer and may be an undoped semiconductor layer.

The p-type cladding layer 70 is formed on the electron blocking layer 60. The p-type cladding layer 70 is a layer formed of p-type AlGaN and is, e.g., an $Al_tGa_{1-t}N$ cladding layer (0≤t≤1) doped with magnesium (Mg) as a p-type impurity. Alternatively, zinc (Zn), beryllium (Be), calcium (Ca), strontium (Sr) or barium (Ba), etc., may be used as the p-type impurity. The p-type cladding layer 70 has a thickness of about 300 nm to 700 nm and is, e.g., about 400 nm to 600 nm in thickness.

The p-type contact layer 80 is formed on the p-type cladding layer 70. The p-type contact layer 80 is, e.g., a p-type GaN layer doped with a high concentration of impurity such as Mg.

The n-side electrode 90 is formed on a certain region of the n-type cladding layer 30. The n-side electrode 90 is formed of, e.g., a multilayered film formed by sequentially stacking titanium (Ti), aluminum (Al), Ti and gold (Au) on the n-type cladding layer 30.

The p-side electrode 92 is formed on the p-type contact layer 80. The p-side electrode 92 is formed of, e.g., a multilayered film formed by sequentially stacking nickel (Ni) and gold (Au) on the p-type contact layer 80.

Next, a method for producing the light-emitting element 1 will be described. The buffer layer 20 is formed on the substrate 10. In detail, the AlN layer 22 and the undoped u-$Al_pGa_{1-p}N$ layer 24 are grown on the substrate 10 at high temperature. Next, the n-type cladding layer 30 is grown on the buffer layer 20 at high temperature. Then, the graded layer 40 is grown on the n-type cladding layer 30 at high temperature while gradually increasing the Al feed rate. In detail, the graded layer 40 is grown at high temperature, with the Al feed rate adjusted so that the Al composition ratio increases about 1.0±0.1% per unit depth (nm). To adjust the Al feed rate, a known technique may be used, such as, e.g., adjusting a ratio of an ammonia gas to a metal material. Alternatively, the growth temperature for the graded layer 40 may be adjusted while maintaining a constant feed rate of an AlGaN raw material, thereby adjusting a relative feed rate of Al. The "feed rate" here means, e.g., a proportion of Al relative to the fed material.

Next, the light-emitting layer 50, the electron blocking layer 60 and the p-type cladding layer 70 are sequentially grown on the graded layer 40 at high temperature. The n-type cladding layer 30, the graded layer 40, the light-emitting layer 50, the electron blocking layer 60 and the p-type cladding layer 70 can be formed by a well-known epitaxial growth method such as Metal Organic Chemical Vapor Deposition (MOCVD), Molecular Beam Epitaxy (MBE), or Halide Vapor Phase Epitaxy (HVPE).

Next, a mask is formed on the p-type cladding layer 70. Then, in the exposed region in which the mask is not formed, the graded layer 40, the light-emitting layer 50, the electron blocking layer 60 and the p-type cladding layer 70 are removed. The graded layer 40, the light-emitting layer 50, the electron blocking layer 60 and the p-type cladding layer 70 can be removed by, e.g., plasma etching. The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 can be formed by, e.g., a well-known method such as electron beam evaporation method or sputtering method. The light-emitting element 1 shown in FIG. 1 is thereby obtained.

Figures 3A, 3B:
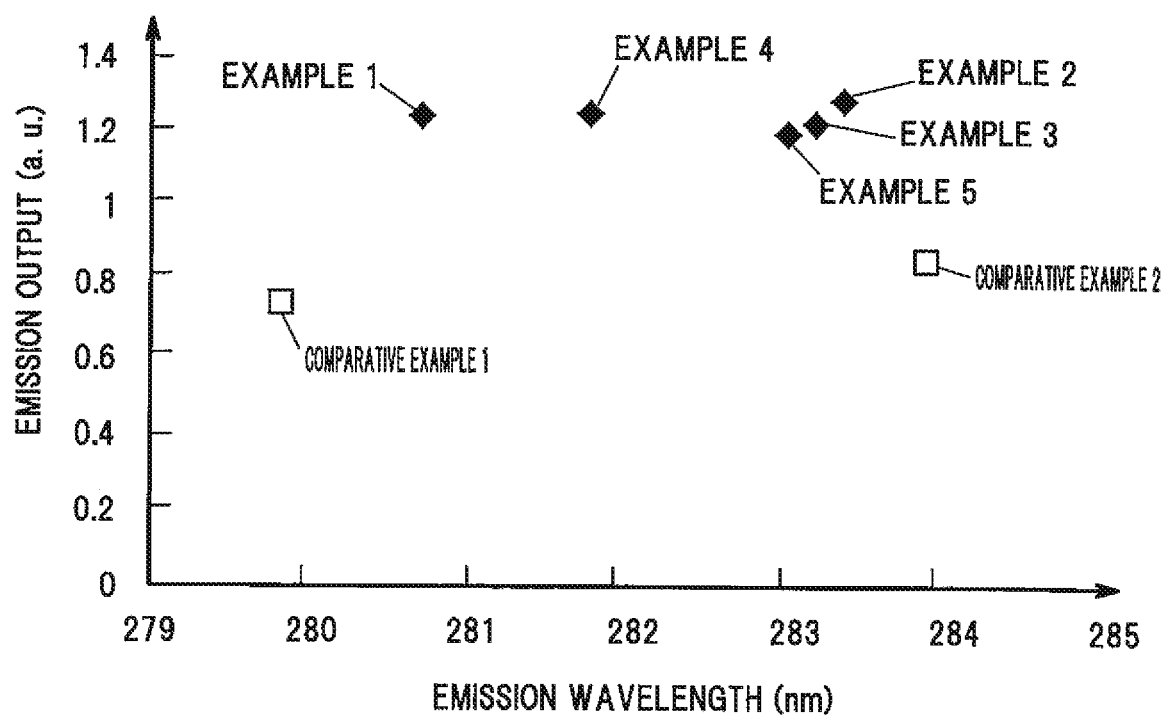
FIG. 3A is a table showing data of wavelength and emission output of light-emitting elements in Examples and Comparative Examples.
FIG. 3B is a graph showing the results shown in FIG. 3A.

Next, Examples in the embodiment of the invention will be described in reference to FIGS. 3A and 3B. FIG. 3A is a table showing data of wavelength and emission output of light-emitting elements 1 in Examples 1 to 5 and light-emitting elements in Comparative Examples 1 and 2, and FIG. 3B is a graph showing the results shown in FIG. 3A. The light-emitting elements 1 in Examples 1 to 5 include the graded layer 40. That is, the Al composition ratio of the light-emitting elements 1 in Examples 1 to 5 gradually increases from the n-type cladding layer 30 side toward the barrier layer 52a located on the n-type cladding layer 30 side in the multiple quantum well layer. Meanwhile, the light-emitting elements in Comparative Examples 1 and 2 do not include the above-described graded layer 40. That is, the Al composition ratio of the light-emitting elements in Comparative Examples 1 and 2 changes sharply between the first Al composition ratio of the n-type cladding layer 30 and the second Al composition ratio of the barrier layer 52a.

Emission outputs (arbitrary unit) of the light-emitting elements 1 in Examples 1 to 5 and the light-emitting elements in Comparative Examples 1 and 2 (in-house comparison) are shown in FIGS. 3A and 3B. Emission wavelength (nm) is a wavelength at which the measured emission output is obtained. In these Examples, as an example, the emission output was measured by a photodetector placed beneath the light-emitting elements 1 during when a current was supplied between the n-side electrode 90 and the p-side electrode 92 described above, even though various known methods can be used to measure the emission output. The wavelength is determined depending on the growth temperature for the graded layer 40 and the light-emitting layer 50.

As shown in FIG. 3A, in Example 1, an emission output of 1.24 was obtained at an emission wavelength of 280.7 nm. In Example 2, an emission output of 1.28 was obtained at an emission wavelength of 283.3 nm. In Example 3, an emission output of 1.23 was obtained at an emission wavelength of 283.1 nm. In Example 4, an emission output of 1.25 was obtained at an emission wavelength of 281.7 nm. In Example 5, an emission output of 1.20 was obtained at an emission wavelength of 283.0 nm.

In contrast to this, in Comparative Example 1, an emission output of 0.74 was obtained at an emission wavelength of 279.8 nm. In Comparative Example 2, an emission output of 0.86 was obtained at an emission wavelength of 283.8 nm.

In sum, the emission output was not less than 1.2 in all of Examples 1 to 5, while the emission output was less than 1.0 in both Comparative Examples 1 and 2. In addition, in all of Examples 1 to 5, the emission output was not less than 1.6 times the emission output in Comparative Example 1 and not less than 1.4 times the emission output in Comparative Example 2. The result described above shows that the light-emitting element 1 has an increased emission output.

Functions and Effects of the Embodiment

As described above, the light-emitting element 1 in the embodiment of the invention is configured that the graded layer 40, of which Al composition ratio gradually increases from the n-type cladding layer 30 side toward the barrier layer 52a located on the n-type cladding layer 30 side in the multiple quantum well layer, is provided between the n-type cladding layer 30 and the barrier layer 52a located on the n-type cladding layer 30 side in the multiple quantum well layer. Due to this configuration, it is possible to increases the emission output of deep ultraviolet light of the light-emitting element 1. It is considered that, by providing the graded layer 40 with such an Al composition ratio between the n-type cladding layer 30 and the barrier layer 52a located on the n-type cladding layer 30 side in the multiple quantum well layer, it is possible to prevent a notch in the band which would occur in conventional light-emitting elements, and also possible to reduce an electric field generated due to the piezoelectric effect.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1), comprising: an n-type cladding layer (30) comprising n-type AlGaN and having a first Al composition ratio; a barrier layer (52a, 52b, 52c) comprising AlGaN that is located on the n-type cladding layer (30) side in a multiple quantum well layer and has a second Al composition ratio greater than the first Al composition ratio; and a graded layer (40) that is located between the n-type cladding layer (30) and the barrier layer (52a, 52b, 52c) and has a third Al composition that is between the first Al composition ratio and the second Al composition ratio, wherein the third Al composition ratio of the graded layer (40) increases at a predetermined increase rate from the first Al composition ratio toward the second Al composition ratio.

[2] The nitride semiconductor light-emitting element (1) described in the above [1], wherein the third Al composition ratio of the graded layer (40) increases diagonally from the first Al composition ratio toward the second Al composition ratio.

[3] The nitride semiconductor light-emitting element (1) described in the above [2], wherein the third Al composition ratio of the graded layer (40) increases diagonally and substantially linearly from the first Al composition ratio toward the second Al composition ratio.

[4] The nitride semiconductor light-emitting element (1) described in any one of the above [1] to [3], wherein the increase rate has a value between 0.9%/nm and 1.1%/nm.

[5] The nitride semiconductor light-emitting element (1) described in any one of the above [1] to [3], wherein the first Al composition ratio of the n-type cladding layer (30) has a value between 50% and 60%.

[6] The nitride semiconductor light-emitting element (1) described in any one of the above [1] to [4], wherein the second Al composition ratio of the barrier layer (52a, 52b, 52c) has a value of not less than 80%.

[7] A production method for a nitride semiconductor light-emitting element (1), comprising: forming an n-type cladding layer (30) comprising n-type AlGaN on a substrate (10); forming, above the n-type cladding layer (30), a barrier layer (52a, 52b, 52c) comprising AlGaN that is located on the n-type cladding layer (30) side in a multiple quantum well layer and has a second Al composition ratio greater than the first Al composition ratio; and forming a graded layer (40) that is located between the n-type cladding layer (30) and the barrier layer (52a, 52b, 52c) and has a third Al composition that is between the first Al composition ratio and the second Al composition ratio, wherein the forming the graded layer (40) is performed while increasing an Al feed rate so that the third Al composition ratio increases at a predetermined increase rate from the first Al composition ratio toward the second Al composition ratio.

INDUSTRIAL APPLICABILITY

Provided is a nitride semiconductor light-emitting element of which emission output can be improved by preventing a notch in the band structure, which may occur at an interface between an n-type cladding layer and a barrier layer located on the n-type cladding layer side in a multiple quantum well layer, and also by reducing an electric field generated due to the piezoelectric effect. A production method for such a nitride semiconductor light-emitting element is also provided.

REFERENCE SIGNS LIST

1: nitride semiconductor light-emitting element (light-emitting element)
10: substrate
30: n-type cladding layer
40: graded layer
50: light-emitting layer
52, 52a, 52b, 52c: barrier layer
54, 54a, 54b, 54c: well layer

The invention claimed is:

1. A nitride semiconductor light-emitting element, comprising:
   an n-type cladding layer comprising n-type AlGaN having a first Al composition ratio;
   a barrier layer comprising AlGaN that is located on the n-type cladding layer side in a multiple quantum well layer and has a second Al composition ratio greater than the first Al composition ratio; and
   a graded layer that is located between the n-type cladding layer and the barrier layer and has a third Al composition ratio that is between the first Al composition ratio and the second Al composition ratio,
   wherein the third Al composition ratio of the graded layer increases at a predetermined increase rate from the first Al composition ratio toward the second Al composition ratio, and wherein the third Al composition ratio of the graded layer increases diagonally and substantially linearly from the first Al composition ratio toward the second Al composition ratio, wherein the predetermined increase rate has a value between 0.9%/nm and 1.1%/nm.

2. The nitride semiconductor light-emitting element according to claim 1, wherein the first Al composition ratio of the n-type cladding layer has a value between 50% and 60%.

3. The nitride semiconductor light-emitting element according to claim 1, wherein the second Al composition ratio of the barrier layer has a value of not less than 80%.

4. A production method for a nitride semiconductor light-emitting element, comprising:
   forming an n-type cladding layer comprising n-type AlGaN on a substrate;
   forming a barrier layer comprising AlGaN that is located on the n-type cladding layer side in a multiple quantum well layer and has a second Al composition ratio greater than the first Al composition ratio; and
   forming a graded layer that is located between the n-type cladding layer and the barrier layer and has a third Al composition ratio that is between the first Al composition ratio and the second Al composition ratio,
   wherein the forming the graded layer is performed while increasing an Al feed rate so that the third Al composition ratio increases at a predetermined increase rate from the first Al composition ratio toward the second Al composition ratio, and wherein the third Al composition ratio of the graded layer increases diagonally and substantially linearly from the first Al composition ratio toward the second Al composition ratio, wherein the predetermined increase rate has a value between 0.9%/nm and 1.1%/nm.

5. The nitride semiconductor light-emitting element according to claim 2, wherein the second Al composition ratio of the barrier layer has a value of not less than 80%.

* * * * *